United States Patent [19]
Bierhoff

[11] Patent Number: 5,097,307
[45] Date of Patent: Mar. 17, 1992

[54] RADIATION SENSITIVE SEMICONDUCTOR DEVICE FOR OPTICAL READING OR WRITING UNIT

[75] Inventor: Martinus P. M. Bierhoff, Eindhoven, Netherlands

[73] Assignee: U.S. Philips Corporation, New York, N.Y.

[21] Appl. No.: 545,423

[22] Filed: Jun. 27, 1990

[30] Foreign Application Priority Data

Jun. 28, 1989 [NL] Netherlands ............... 8901629

[51] Int. Cl.[5] ........................................... H01L 27/14
[52] U.S. Cl. ..................................... 357/30; 357/32; 357/43; 250/211 J; 369/44.36; 369/44.37
[58] Field of Search ............ 357/30 P, 30 G, 30 H, 357/30 D, 30 S, 32, 43; 250/211 J; 369/44.36, 44.37

[56] References Cited

U.S. PATENT DOCUMENTS

| | | | |
|---|---|---|---|
| 3,786,264 | 1/1974 | Ferro et al. | 250/211 J X |
| 4,663,749 | 5/1987 | Bierhoff et al. | 369/44.36 |
| 4,669,071 | 5/1987 | Minami et al. | 369/44.37 X |
| 4,837,429 | 6/1989 | Umezawa et al. | 357/30 D X |

FOREIGN PATENT DOCUMENTS

| | | |
|---|---|---|
| 0251402 | 1/1988 | European Pat. Off. |
| 61-154063 | 7/1986 | Japan |
| 2080026 | 1/1982 | United Kingdom |

*Primary Examiner*—William Mintel
*Attorney, Agent, or Firm*—David R. Treacy

[57] ABSTRACT

A radiation-sensitive semiconductor device comprises a semiconductor body having a first semiconductor region of a first conductivity type, which adjoins with one side a surface of the semiconductor body and adjoins within it at a certain distance from and substantially parallel to the surface a second semiconductor region of a second conductivity type opposite to the first type and forms with it a first pn junction. Such semiconductor devices are used in a reading or writing unit for a system for optical recording, such as CD, LV, DOR and CDV.

In one embodiment having a semiconductor region at least two further regions are present, which are located at the surface and each form with the first semiconductor region a further pn junction substantially parallel to the surface and at a smaller distance therefrom than the first pn junction. Moreover, the further regions, like the first semiconductor region, are coupled to reading members, by means of which a current can be measured. As a result, the further semiconductor regions can be thin and can therefore be arranged close to each other so that a focus error signal without a dip is obtained via the reading members coupled to these regions. Since the further regions result in diodes having an inverse polarity, class B amplifiers based on npn transistors may now be integrated in with the semiconductor device so that a separation circuit requiring comparatively large capacitances is no longer necessary.

15 Claims, 3 Drawing Sheets

RADIATION SENSITIVE SEMICONDUCTOR DEVICE FOR OPTICAL READING OR WRITING UNIT

BACKGROUND OF THE INVENTION

The present invention relates to a radiation-sensitive semiconductor device having a semiconductor body wherein a first semiconductor region of a first conductivity type has one side at the surface of the semiconductor body and adjoins within the semiconductor body at a certain distance from and substantially parallel to the surface with a second semiconductor region of a second conductivity type opposite to the first type and forming a first pn junction therewith. The invention further relates to a reading or writing unit comprising such a radiation sensitive device.

Such radiation-sensitive semiconductor devices area necessary component of an optical recording system, such as the so-called Compact Disk (CD), laser vision (LV) and Compact Disk Video (CDV), for which information can be read optically, or the Digital Optical Recording (DOR), wherein information is written and read. In such systems, electromagnetic radiation is applied to the information carrier and information is obtained from the reflected radiation by detecting it by means of a radiation-sensitive semiconductor device of the type referred to in the foregoing. Especially, use when is to be made of a number (for example four) of such semiconductor regions and associated pn junctions, these devices are arranged adjacent to each other.

Such a radiation-sensitive semiconductor device is known from the English abstract of Japanese Kokai 61-154063 (date of publication July 12, 1986), which is published in Pat. Abstracts of Japan, Vol. 10, Nov. 29, 1986, No. 356 (E-459), p. 26 under No. E-45926. A semiconductor body is described therein having a first semiconductor region of the n-conductivity type, which is disposed in an epitaxial layer of the n-conductivity type adjoining the surface and which adjoins within the semiconductor body at a certain distance from and parallel to the surface an epitaxial layer of the p-conductivity type and forms a pn junction therewith.

A disadvantage of the known radiation-sensitive semiconductor device is that, when several of such pn junctions are arranged beside each other in the semiconductor body—for example to detect different parts of a radiation beam—, the separation region of such pn junctions—viewed laterally—causes a large dip in the radiation sensitivity. Two pn junctions are separated laterally in the known semiconductor device by a region of the p-conductivity type sunken into the epitaxial layer of the n-conductivity type. When the distance of the pn junction from the surface is, for example, 10 μm—a distance necessary for radiation having a large depth of penetration—, the width of this insensitive region is also about 10 μm. This is very objectionable especially for beams of radiation commonly used in practice which have a diameter of a few tens of microns. The same disadvantage also occurs when the separation is constituted by an etched groove. Another disadvantage of the known semiconductor device is due to the required presence of a separation circuit comprising capacitors having a capacitance of about 40 pF between the amplifiers connected to the pn junctions and constructed as a split-band amplifier. The amplifiers comprise on the one hand four D.C.-coupled amplifiers each amplifying a current through a pn junction, with which the so-called focus error signal is formed, and on the other hand one A.C.-coupled amplifier for amplifying the sum of the currents through the pn junctions, with which the so-called data signal is formed. When these capacitors are integrated, comparatively large parasitic capacitances are obtained with respect to the substrate, which is undesirable for the amplification of the data signal. A further disadvantage of the known radiation-sensitive semiconductor device consists is the limited possibility of integration of the most suitable amplifiers for the focus error signal. For this signal, the most suitable amplifiers are so-called Class B amplifiers, which have a small offset. When the substrate is of the p-conductivity type, the first semiconductor region forms part of an epitaxial layer of the n-conductivity type and the Class B amplifier must comprise pnp transistors. Pnp transistors having accurately defined properties cannot readily be manufactured in an n-type epitaxial layer because they must be formed laterally. For an n-type substrate and a p-type epitaxial layer, the same holds for the npn transistors then required.

SUMMARY OF THE INVENTION

An object of the present invention is to provide a radiation-sensitive semiconductor device, which, when several pn junctions are present, does not exhibit a significant dip in the radiation sensitivity and which permits an integration of Class B amplifiers, wherein large capacitances are not required.

According to the invention, a radiation-sensitive semiconductor device of the foregoing described type, when viewed in projection, within the first semiconductor region has at least two further regions which are located at the surface and each form a further pn junction with the first semiconductor region substantially parallel to the surface and at a smaller distance therefrom than the first pn junction and are coupled, like the first semiconductor region, to reading members by means of which a current can be measured. Thus, these disadvantages are eliminated to a considerable extent:

In the first place, the additional pn junctions may be arranged much more closely to each other laterally because they are located closer to the surface. As a result, the dip in the photosensitivity to the focus error signal becomes much smaller. At the same time, the photosensitivity to the data signal remains high because it is derived from the current in the reading member coupled to the first semiconductor region. The photosensitivity of these additional pn junctions used for the focus signal, which is comparatively low with respect to the known semiconductor device can be compensated for by amplification because the noise then occurring is of high frequency (MHz range), while the focus error signal is of low frequency (kHz range). In the second place, the most suitable Class B amplifiers can now be integrated because the polarity of the further pn junctions used for the focus error signal is inverse with respect to the polarity of the pn junctions in the known device. For an epitaxial layer of the n-conductivity type, such an amplifier now comprises npn transistors, while in the case of a layer of the p-conductivity type these transistors are now pnp transistors. Finally, with integration of amplifiers for both the data signal and the focus error signal due to the connection scheme of amplifiers to the radiation-sensitive semiconductor device according to the invention the addition of comparatively large capacitors can be omitted.

In a first illustrative embodiment, within the first semiconductor region four further regions are present, these regions are located at the surface and are each situated in a quadrant of the first semiconductor region. Such an embodiment is particularly suitable for the aforementioned use in a system for optical recording. The data signal corresponds to the overall current in the four quadrants. The focus error signal is derived, for example, from the difference of the sum of the currents in quadrants located on a diagonal and the sum of the currents in the quadrants located on the other diagonal.

In another illustrative embodiment, the relative distance of the further semiconductor regions is so small that at a usual cut-off voltage the depletion regions contact each other at the surface. As a result, a dip in the response, when the beam of radiation is present above the region between the further semiconductor regions, becomes a minimum.

In a further embodiment, the further regions are regions of the second conductivity type, which are sunken into the first semiconductor region over a part of the thickness thereof from the surface. The further regions can thus be obtained in a simple manner, for example by implantation or diffusion.

The relative distance of the further regions is preferably not more than 5 $\mu$m and is chosen so that the depletion regions of the further pn junctions contact each other at the surface, as a result of which a minimum dip in the photosensitivity occurs. The distance of the first pn junction from the surface is at least equal to the depth of penetration of the electromagnetic radiation to be measured and the distances of the further pn junctions from the surface are small with respect thereto. Thicknesses and doping concentrations are chosen so that at a usual cut-off voltage—for example 5 V—across the pn junctions a complete depletion occurs. The term "depth of penetration" is to be understood to mean herein the distance over which the intensity of the radiation has decreased by a factor 1/e. When all radiation is detected within the depth of penetration, that is to say that all the electron-hole pairs generated are collected, the quantum efficiency is (1−1/e), which is approximately 0.63 or 63%. For increasing the efficiency, the surface of the radiation-sensitive semiconductor body can be covered with a suitable so-called anti-reflex coating. For detecting electromagnetic radiation in the wavelength range of about 700 to 900 nm, which is a range typical of optical recording systems, the semiconductor body is preferably made of silicon and the distance of the first pn junction from the surface is at least from about 5 to about 15 $\mu$m, while the distance of the further pn junctions from the surface is about 2 $\mu$m. The depth of penetration follows from the absorption coefficient, which varies for this wavelength range from about 2000 to 650 cm$^{-1}$ and varies from about 5 $\mu$m to about 15 $\mu$m. For a wavelength of 800 nm, which corresponds to a wavelength of a GaAs/AlGaAs semiconductor diode laser commonly used in practice, the distance of the first pn junction from the surface is about 9 $\mu$m and the distance of the further pn junctions from the surface is about 2 $\mu$m.

A further illustrative embodiment of a radiation-sensitive semiconductor device according to the invention is characterized in that the first semiconductor region forms part of an epitaxial layer of the first conductivity type, which is located on a semiconductor substrate of the second conductivity type and in which a third semiconductor region of the second conductivity type is disposed, which is sunken from the surface, reaches as far as the semiconductor substrate and encloses, viewed in projection, the first semiconductor region, while the further regions are semiconductor regions sunken from the surface. By using an epitaxial layer, the radiation-sensitive semiconductor device according to the invention can be manufactured in a simple manner and with very favourable properties. Moreover, inter alia the required amplifiers can thus readily be integrated. Outside the first semiconductor region, other regions located at the surface, which may also be sunken semiconductor regions of the first conductivity type, may be provided, which form other pn junctions with other semiconductor regions of the second conductivity type within the semiconductor body approximately parallel to the surface and at a smaller distance therefrom than the first pn junction, which other regions are coupled to further reading members, by which a current can be measured. In a system for optical recording, for example the so-called tracking may be ensured with these other pn junctions located outside the pn junctions arranged in a quadrant. If, for example, two of such other pn junctions are present, a tracking signal may be formed from the difference of the currents through the one and through the other pn junction. These other pn junctions may also be separated from their environment by a separation isolation. Preferably, a radiation-sensitive semiconductor device according to the invention is manufactured starting from a p-type silicon substrate with an n-type epitaxial layer disposed thereon.

In a further illustrative embodiment, the amplifiers for the current in the reading members coupled to the first semiconductor regions and to the further or other regions are included in the semiconductor body. This important embodiment offers the possibility of manufacturing compact and inexpensive devices having excellent properties. The amplifiers for the current in the reading members coupled to the further or other regions are preferably Class B amplifiers. Such an amplifier has a very small offset, which is of particular importance for the focus error signal. The amplifier for the current in the reading member coupled to the first semiconductor region is preferably a broadband amplifier, by which a low-noise amplification of the data signal can be obtained.

More particularly if the amplifiers are integrated in the semiconductor device, a reading or writing unit may be obtained having excellent properties and a small number of components, as a result of which the cost of such a unit is comparatively low.

A further explanation of the invention will now be presented with reference to an illustrative and the accompanying drawings, in which.

Figure 1:
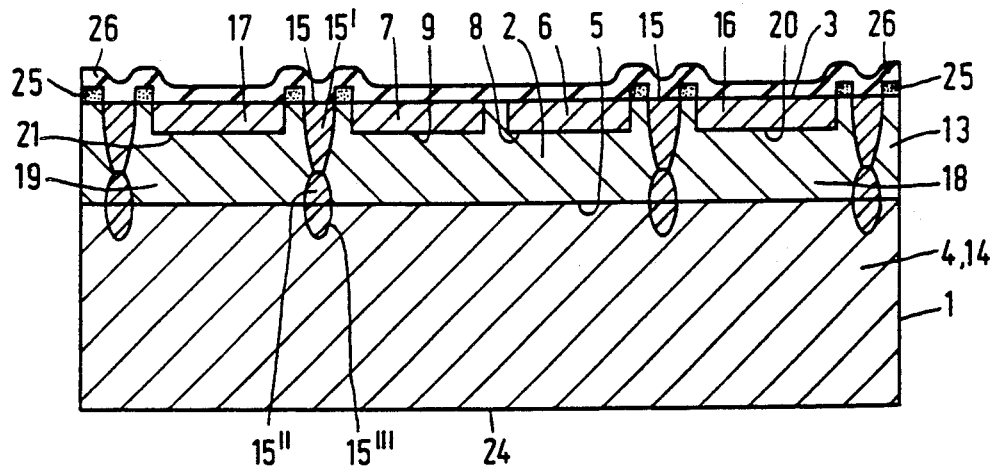
FIG. 1 is a cross-section taken on the line I—I of FIG. 2 of an illustrative embodiment of a radiation-sensitive semiconductor device according to the invention.

The Figures are schematic and not drawn to scale, while for the sake of clarity particularly the dimensions for illustrating of thickness are exaggerated. Corresponding parts are generally designated by the same reference numerals in the different Figures. Semiconductor regions of the same conductivity type are generally cross-hatched in the same direction.

DETAILED DESCRIPTION OF THE PREFERRED EMBODIMENT

Figure 2:
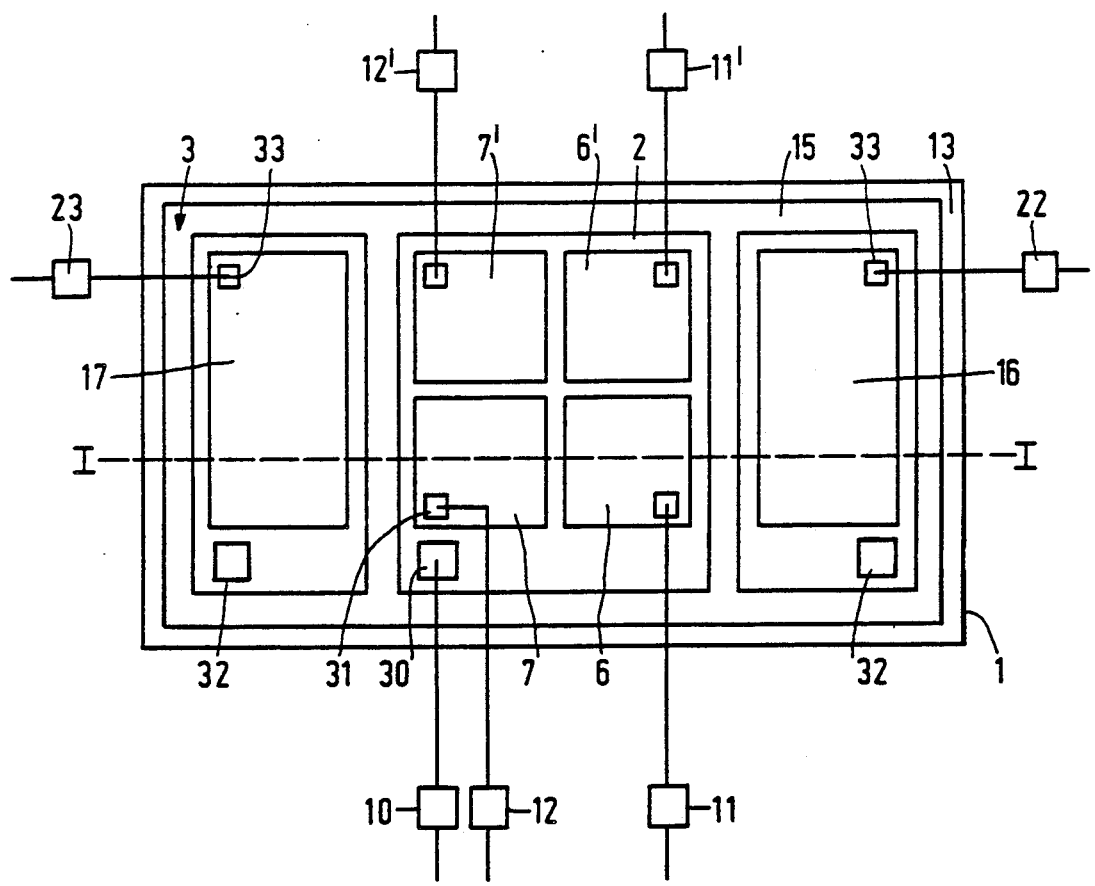
FIG. 2 is a plan view of the radiation-sensitive semiconductor device of FIG. 1.

FIG. 1 shows in cross-section an illustrating embodiment of a radiation-sensitive semiconductor device according to the invention comprising a semiconductor body 1, of which a representative part is shown in the Figure. FIG. 2 is a plan view of the radiation-sensitive semiconductor device of FIG. 1. The semiconductor body 1 comprises a substrate 14, in this example of silicon having a doping of about $5 \times 10^{15}$ at/cm$^3$ for the p-conductivity type. A semiconductor layer 13 of silicon is disposed thereon having a thickness of about 9 $\mu$m, a doping of about $3.5 \times 10^{15}$ at/cm$^3$ for the n-conductivity type. Regions 15 of the p-conductivity type are present therein, which have a doping concentration of about $10^{18}$ at/cm$^3$ and extend as far as the substrate 14. In the semiconductor layer 13 is provided within the sunken regions 15 a semiconductor region 2, which forms with the substrate 14 a pn junction 5, which is located at a distance of, in this example 9 $\mu$m from the surface 3 and approximately parallel thereto. Viewed in projection, a number (in this example four) of further regions 6, 7, 6', 7' located at the surface and consisting in this example of sunken semiconductor regions of the p-conductivity type, are present within the semiconductor region 2, which regions each form a further pn junction 8, 9 with the first semiconductor region 2 approximately parallel to the surface 3 and at a smaller distance therefrom than the first pn junction 5. The first semiconductor region 2 is coupled to a reading member 10 and the further regions 6, 7, 6', 7' are coupled to reading members 11, 12, 11', 12', by which a current can be measured. The semiconductor regions 6, 7, 6', 7' have a doping concentration of about $10^{18}$ at/cm$^3$. The dimensions of the contact regions 30, 31, 33 are about $6 \times 6$ $\mu$m$^2$. The dimensions of the semiconductor region 2 are about $90 \times 90$ $\mu$m$^2$ and those of the semiconductor regions 6, 7 are about $40 \times 40$ $\mu$m$^2$. The width of the sunken semiconductor region 15 is about 10 $\mu$m and the relative distance of the semiconductor regions 6, 7 and the smallest distance therefrom from the semiconductor region 15 is about 5 $\mu$m. In this example, within the semiconductor layer 13, viewed in projection, outside the first semiconductor region 2 further other regions 16, 17 located at the surface, in this example two sunken semiconductor regions of the p-conductivity type, are present within other semiconductor regions 18, 19 of the n-conductivity type, which other regions form within the semiconductor body 1 at a distance of in this example about 2 $\mu$m from and approximately parallel to the surface 3 other pn junctions 20, 21 with these other semiconductor regions 18, 19. The further other regions 16, 17 are coupled via the contact regions 33 to further reading members 22, 23, by which a current can be measured. The other semiconductor regions 18, 19 are also surrounded by a p-type semiconductor region 15. On the surface 3 is disposed an approximately 1 $\mu$m thick electrically insulating layer 25 of silicon dioxide, which is interrupted at the area of the semiconductor regions 6, 7, 16, 17. In this example, an approximately 100 nm thick so-called anti-reflex coating of silicon nitride is present on this layer. The relative distance of the semiconductor regions 6, 7, 6', 7', in this example 3 $\mu$m, is chosen to be so small that the depletion regions of the pn junctions 8, 9, 8', 9' contact each other at the surface at 5 V. The radiation-sensitive semiconductor device of this example is suitable for an optical recording system operating at a wavelength of about 800 nm, for which the depth of penetration is about 9 $\mu$m. The distance of the further pn junctions 8, 9 from the surface 3, in this example about 2 $\mu$m, is small with respect to the depth of penetration. All distances and doping concentrations are chosen so that at a cut-off voltage of about 5 V a substantially complete depletion occurs. In the reading member 10, during operation a photocurrent was measured which corresponds to a responsiveness of 0.42 A/W, while in the reading members 11, 12, 11', 12', 22, 23 a photo-current was measured corresponding to a responsiveness of about 0.17 A/W. From the currents in the reading members 22, 23 coupled to the semiconductor regions 16, 17 included in this embodiment, in a reading or writing member for an optical recording system the so-called "tracking signal" having a band width of a few kHz is derived. Due to the relative positions of the semiconductor regions 2, 4, 6, 7 with respect to each other in the semiconductor body 1 and by a suitable choice of the semiconductor regions to which reading members are coupled, i.e. the semiconductor regions 2, 6, 7 and, if present, the semiconductor regions 16, 17, a number of advantages are thus surprisingly obtained: in the first place, in the reading member 10 coupled to the semiconductor region 2, the aforementioned high responsiveness is attained when the pn junctions 5, 8, 9 are furnished with a sufficiently high cut-off voltage. In a reading or writing member of a system for optical recording of information, the information can be read out from the signal obtained with this high responsiveness. The frequency of this so-called "data signal" is about 10 MHz and the signal can be amplified by so-called broadband amplifiers. Moreover, when the spot of the beam of electromagnetic radiation to be detected, which has, for example, a diameter of about 50 $\mu$m, moves over the surface 3 of the semiconductor body 1 from, for example, the semiconductor region 6 to the semiconductor region 7, only a very small dip in the aforementioned high responsiveness is observed. As a result, a better focus error signal is obtained. The lower responsiveness in the reading members 11, 12 coupled to the semiconductor regions 6, 7 is not objectionable because the signal in this reading member, which is of comparatively low frequency (about 20 kHz), can be subjected to a low-noise amplification. The same applies to the reading members 22, 23. Further, the polarity of the pn junctions 8, 9, like the polarity of the pn junctions 20, 21, in deviation from the polarity of the pn junction 5, is suitable for connection to a so-called Class B amplifier comprising npn transistors, which can be excellently integrated in the semiconductor body. Finally, in the amplifiers for the radiation-sensitive devices no large capacitors need to be included, which, especially when these amplifiers are integrated in the semiconductor body, is a great advantage.

Figure 3:
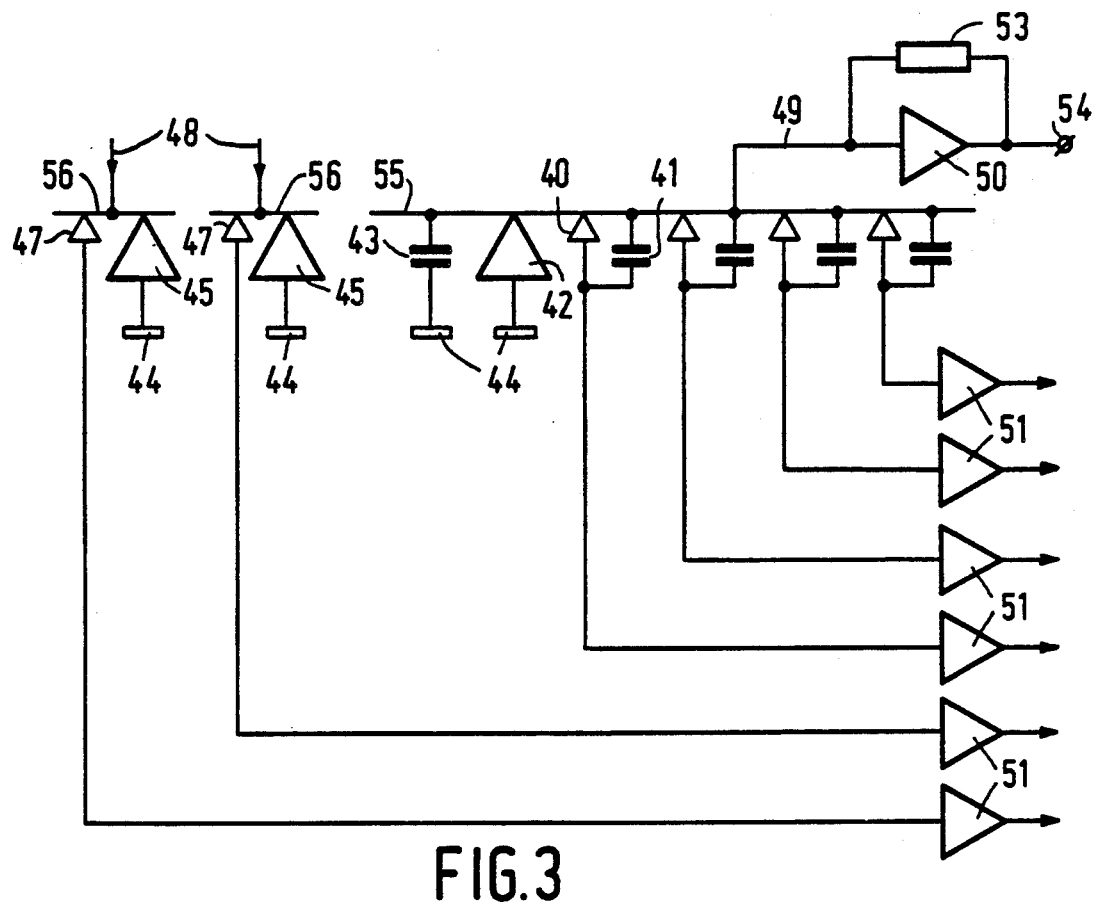
FIG. 3 shows diagrammatically an amplifier circuit for an optical recording system, in which the radiation-sensitive semiconductor device of FIG. 1 is included.

In FIG. 3, for illustration, the connection scheme of the reading members coupled to the radiation-sensitive semiconductor device of this embodiment is shown diagrammatically and separately. The epitaxial layer (13 in FIG. 1) is indicated here as a common cathode 55, with which the substrate 44 (4 in FIG. 1) forms a diode 42 having a capacitance 43 with respect to the substrate of about 1 pF and with which the further regions (6, 7, 6', 7' in FIG. 1) located at the surface form four diodes 40 having a capacitance 41 of about ¼ pF. The cathode 55 is connected via a connection 49 to a broadband amplifier 50, across which a feedback resistor 53 of about 20 kΩ is arranged and from which the data signal is obtained at 54. The diodes 47 used for the tracking signal and connected to a cathode 56 are furnished with a positive voltage via a connection 48. Between these cathodes and the substrate 44, diodes 45 are formed, which correspond to the diode 42. The diode 40 with which the focus error signal is formed and the diodes 47 are each connected to a Class B amplifier 51, of which consequently six are present.

Figure 4:
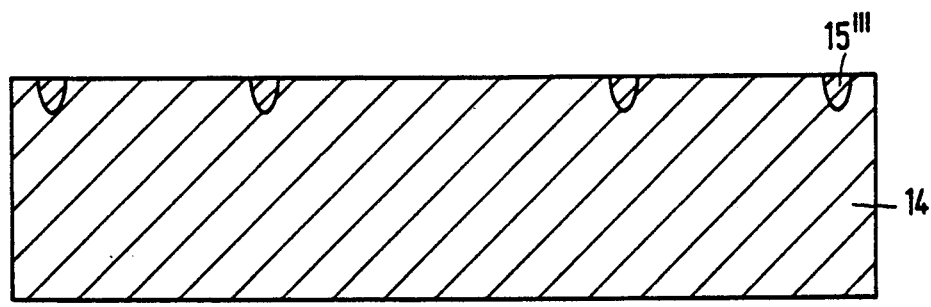
FIGS. 4 and 5 show the radiation-sensitive semiconductor device of FIG. 1 at successive stages of manufacture.
Figure 5:
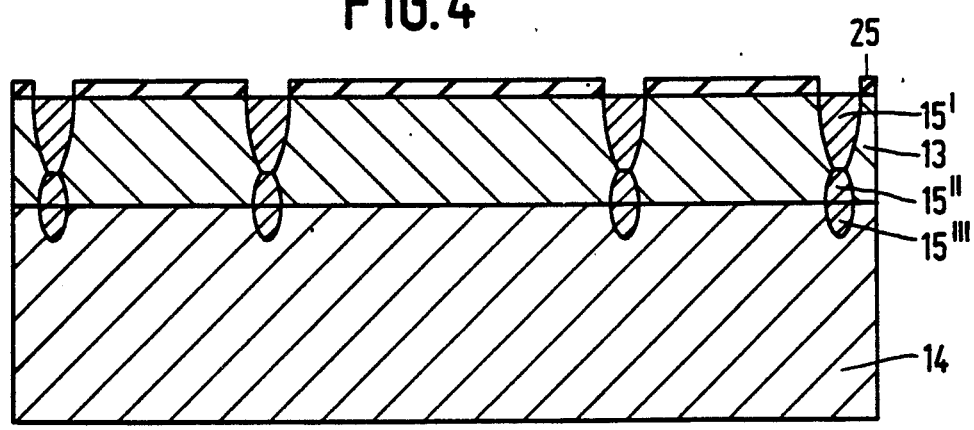

The radiation-sensitive semiconductor device described may be manufactured as follows (see FIGS. 4 and 5). The starting material is a substrate 14 of monocrystalline p-type silicon having a doping concentration of about $5 \times 10^{15}$ at/cm$^3$. Subsequently, the semiconductor regions 15''' are formed in the surface of the semiconductor substrate 14, for example by means of ion implantation (see FIG. 4). Subsequently, an n-type epitaxial layer 13 of silicon is grown thereon having a thickness of about 9 μm and a doping concentration of about $3.5 \times 10^{15}$ at/cm$^3$. The semiconductor body is then provided with a layer 25, which comprises thermal silicon dioxide (see FIG. 5). In a usual manner, openings are formed therein, whose position corresponds to the regions 15''', which during the growing process also have formed the regions 15'' in the epitaxial layer 13 by outdiffusion from the substrate 14. Subsequently, by deposition of an acceptor the regions 15' are formed, after which by diffusion a connection is formed between the regions 15' and 15''. Openings are then formed in the isolating layer 25, in which the semiconductor regions 6, 7, 16, 17 are formed by means of acceptor deposition (see FIG. 1). Subsequently, after cleaning, an anti-reflex coating 26 consisting of silicon nitride having a thickness of about 100 nm is applied by means of, for example, sputtering. This anti-reflex coating 26 is not necessary, but may be used advantageously. Subsequently, the contact regions 30, 31, 32, 33 are formed in a usual manner and these regions are connected via connection conductors to the reading members 10, 11, 12, 22, 23 and in the operating condition they are furnished via these regions or via separate connection conductors by connection to a voltage source with a sufficiently high cut-off voltage.

Class B amplifiers, i.e. amplifiers having a current amplifier in the Class B adjustment, are very suitable, for amplifying the focus error signal and the tracking signal as already has been stated above inter alia in the description of FIG. 3. For further details about these amplifiers, reference may be made to Netherlands Patent Application 8500059 in the name of the Applicant, which has been laid open to public inspection on Aug. 1, 1986. An example of an electric circuit diagram of such an amplifier is shown diagrammatically in FIG. 6. A photodiode 60 is present therein, for example the diode 40 of FIG. 3, which is designated by the symbol for a current source and which is connected on the one hand at the point 67 via a resistor (not shown) to a supply connection point and on the other hand to the input 68 of the amplifier. The amplifier comprises an input stage comprising a current mirror of transistors 61 and 62. This current mirror automatically obtains a Class B adjustment in that it receives as input current the current supplied by the photodiode 60. The output transistor 62 of said mirror is therefore adjusted by the signal current itself and does not supply an output current when the signal current is zero and therefore does not exhibit any offset. The collector of the transistor 62 leads via the point 66 and a current mirror of two transistors (not shown) to an output stage (not shown either), which may be a conventional output stage. In order to considerably increase the amplification of the combination of transistors 61 and 62 with respect to the current mirror amplification, a comparatively low-ohmic voltage source 63 with direct voltage drop E is included in the emitter lead of the transistor 61. By addition of this source, the amplification becomes (with equal effective emitter surfaces) equal to $e^{(qE/kT)}$, where q is the elementary charge, k is the Boltzmann constant and T is the absolute temperature.

Figure 6:
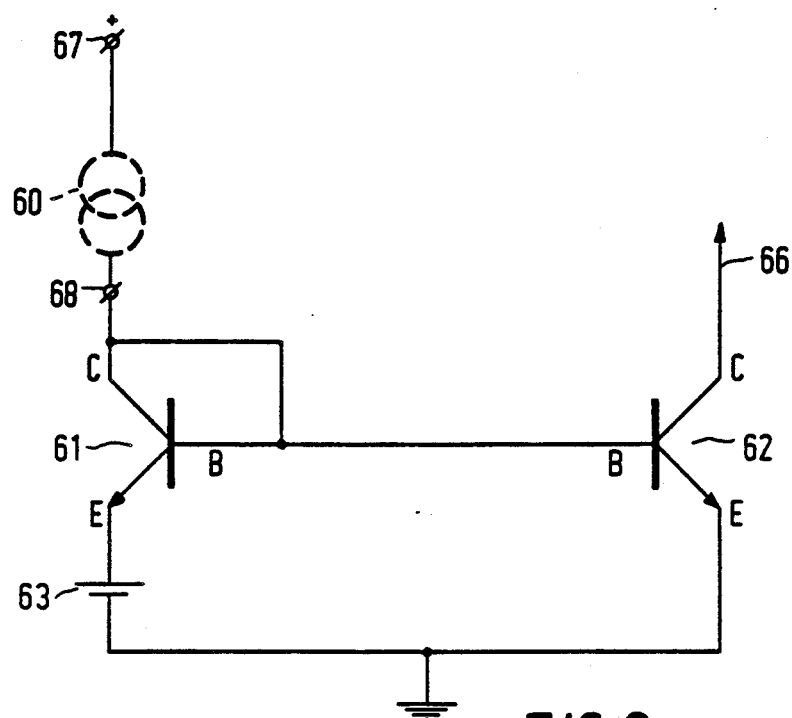
FIG. 6 shows the electric circuit diagram of a Class B amplifier.
Figure 7:
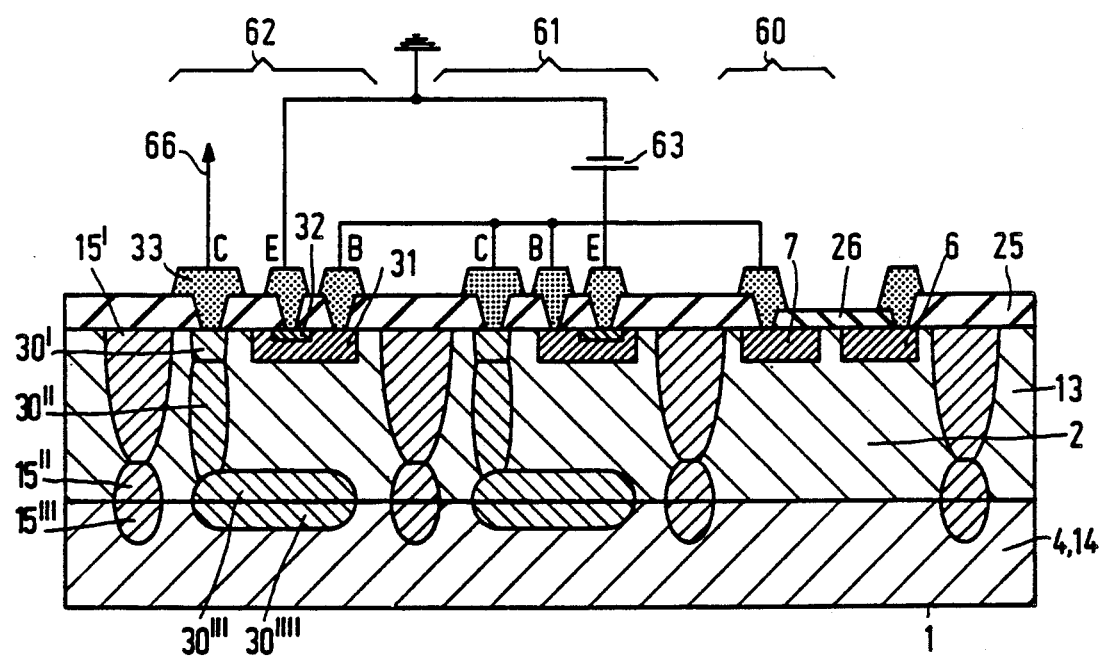
FIG. 7 is a cross-section of an embodiment of a radiation-sensitive semiconductor device according to the invention, with which a Class B amplifier of FIG. 6 is integrated.

FIG. 7 shows in cross-section an embodiment of a radiation-sensitive semiconductor device according to the invention, with which a Class B amplifier as shown in FIG. 6 is integrated. The regions corresponding to those indicated in FIG. 1 are provided with the same reference numerals. The photodiode 60 constitutes one of the diodes of FIG. 1 arranged in a quadrant. The transistors 61 and 62 comprise a p-type base region 31 and an n-type emitter region 32. The collectors of these transistors comprise the regions 30', 30'', 30''' and 30'''', which constitute a shallow region, a deep region, an outdiffused region and a buried n+ region, respectively. The base, emitter and collector connections are as shown in FIG. 6. The radiation-sensitive semiconductor device according to the invention shown in this embodiment provided with a Class B amplifier can be manufactured in the same manner as indicated in another embodiment. The collectors, which comprise n-type semiconductor regions, are manufactured in the same manner as the separation isolation 15, which comprises p-type semiconductor regions.

It should be noted here that the semiconductor layers may also have conductivity types or doping concentrations other than those mentioned here. Other dopants may also be used.

The invention is not limited to the embodiments described because within the scope of the invention many modifications and variations are possible for those skilled in the art. For example, semiconductor materials or compositions of the chosen semiconductor materials other than those mentioned in the embodiments may be used. Inter alia binary, ternary or quaternary III—V semiconductor materials may also be used.

The conductivity types may also all be replaced (simultaneously) by the opposite types. As already stated above, the embodiments in which an epitaxial layer of the n-conductivity type is provided on a semiconductor substrate of the p-conductivity type is of particular advantage. In a standardized manner, npn transistors can be integrated therein, with which amplifiers for the signal currents produced in the semiconductor device are formed. In particular, so-called Class B amplifiers can thus be integrated in the radiation-sensitive semiconductor device, which are connected to the semiconductor regions sunken from the surface. The polarity of the last-mentioned regions—which in this case are of the p-conductivity type—is suitable for this purpose.

Besides, the invention is not limited to the use of an epitaxial layer and to the use of implanted and diffused separation isolations to form the semiconductor regions, as in the embodiments described. For example, the further regions located at the surface may also comprise thin metal layers, which form with the semiconductor body a Schottky junction, which is radiation-sensitive, provided that the metallic layer is transparent for the radiation to be detected. When the further regions located at the surface comprise semiconductor regions, the latter may also be formed by local and/or selective epitaxy on a semiconductor body covered by a masking layer in openings provided in said masking layer. Further, the first semiconductor region or more of those regions may also be obtained by a combination of ion implantation and diffusion and instead of a separation isolation obtained by means of ion implantation and diffusion a separation isolation obtained by means of etched grooves may be used. Local oxidation or a combination of etching of grooves and oxidation or other conventional methods of isolation, such as ion implantation, may be used.

I claim:

1. A radiation-sensitive semiconductor device comprising a semiconductor body comprising:
    a first semiconductor region of a first conductivity type, the region having a first side adjoining a surface of the semiconductor body and a second side within the semiconductor body at a given distance from and substantially parallel to the surface;
    a second semiconductor region of a second conductivity type opposite the first type, adjoining and forming a first pn junction with the first region along said second side;
    at least two further regions located at the surface and within the first semiconductor region, each further region forming a further pn junction with the first semiconductor region substantially parallel to the surface and at a smaller distance therefrom than the first pn junction, and
    means for coupling the first and two further semiconductor regions to first, second and third reading members, by means of which a current can be measured due to carrier generation in said regions.

2. A radiation-sensitive semiconductor device as claimed in claim 1, in which the further regions comprise four further regions within the first semiconductor region, the four further regions being located at the surface and each further region being arranged within a quadrant of the first semiconductor region.

3. A radiation-sensitive semiconductor device as claimed in claim 1, in which the further regions comprise semiconductor regions of the second conductivity type, which are sunken from the surface into the first semiconductor region over a portion of its thickness.

4. A radiation-sensitive semiconductor device as claimed in claim 1, in which the relative distance between the further regions is sufficiently small that upon being biased by a typical cut-off voltage depletion regions are formed which contact each other at the surface.

5. A radiation-sensitive semiconductor device as claimed in claim 4, in which the relative distance between the further regions is at most 5 $\mu$m.

6. A radiation-sensitive semiconductor device according to claim 1, in which the distance of the first pn junction from the surface at least corresponds to the depth of penetration of the electromagnetic radiation to be measured; the distance of the further pn junctions from the surface is small with respect to the depth of penetration; and the distances and doping concentrations of the semiconductor regions are chosen so that said regions are depleted over a large part of the said distances when a usual cut-off voltage is applied across the pn junctions.

7. A radiation-sensitive semiconductor device as claimed in claim 6, for detecting electromagnetic radiation, of a wavelength between about 700 nm and about 900 nm, the semiconductor body comprising silicon, wherein the distance of the first pn junction from the surface is at least from about 5 to about 15 $\mu$m and the distance of the further pn junctions from the surface is from about 0.5 to 3 $\mu$m.

8. A radiation-sensitive semiconductor device as claimed in claim 7 for detecting electromagnetic radiation of a wavelength of about 800 nm, in which the distance of the first pn junction from the surface is about 8 $\mu$m and the distance of the further pn junctions from the surface is about 2 $\mu$m.

9. A radiation-sensitive semiconductor device as claimed in claim 1 in which the first semiconductor region is one of the n-conductivity type.

10. A radiation-sensitive semiconductor device as claimed in claim 1 serving as a reading or writing unit for reading or writing information in an optical recording system.

11. A radiation-sensitive semiconductor device comprising a semiconductor body comprising:
    an epitaxial layer of a first conductivity type disposed on a semiconductor substrate of a second conductivity type opposite said first conductivity type, said epitaxial layer having formed therein a first semiconductor region of said first conductivity type, the region having said first side adjoining a surface of the semiconductor body and a second side within the semiconductor body at a given distance from and substantially parallel to the surface, said second side forming a first pn junction with said substrate,
    at least two further regions sunken from the surface and within the first semiconductor region, each further region forming a further pn junction with the first semiconductor region substantially parallel to the surface and at a smaller distance therefrom than the first pn junction,
    a third semiconductor region of the second conductivity type, sunken from said surface and extending as far as the semiconductor substrate, and enclosing the first semiconductor region, and
    means for coupling the first and two further semiconductor regions to first, second and third reading members, by means of which a current can be measured due to carrier generation in said first semiconductor region and said further regions.

12. A radiation-sensitive semiconductor device as claimed in claim 11, comprising other regions of the first conductivity type located at the surface of the semiconductor body outside the first semiconductor region and regions within the other semiconductor regions of the second conductivity type, which form other pn junctions with said other semiconductor regions within the semiconductor body substantially parallel to the surface and at a smaller distance therefrom than the first pn junction, which other regions are coupled to further reading members, by means of which a current can be measured.

13. A radiation-sensitive semiconductor device as claimed in claim 11, comprising amplifiers included in said semiconductor body, respectively coupled to said reading members.

14. A radiation-sensitive semiconductor device as claimed in claim 13, in which each of said amplifiers comprises a respective Class B amplifier.

15. A radiation-sensitive semiconductor device as claimed in claim 14, in which the amplifier for the current in the reading member coupled to the first semiconductor region comprises a broadband amplifier.

* * * * *